United States Patent [19]

Akkapeddi et al.

[11] Patent Number: 4,810,621

[45] Date of Patent: Mar. 7, 1989

[54] CONTACT LITHOGRAPHIC FABRICATION OF PATTERNS ON LARGE OPTICS

[75] Inventors: Prasad R. Akkapeddi, Norwalk; Robert E. Hufnagel, Ridgefield, both of Conn.

[73] Assignee: The Perkin-Elmer Corporation, Norwalk, Conn.

[21] Appl. No.: 8,230

[22] Filed: Mar. 27, 1987

Related U.S. Application Data

[62] Division of Ser. No. 799,390, Nov. 18, 1985, Pat. No. 4,668,083.

[51] Int. Cl.⁴ .............................................. G03C 5/00
[52] U.S. Cl. ...................... 430/321; 430/22; 430/323; 430/327; 430/329; 430/330
[58] Field of Search ............. 430/321, 323, 324, 329, 430/330, 331, 22, 24, 5, 1, 2, 327; 350/3.75, 3.7

[56] References Cited

U.S. PATENT DOCUMENTS

| | | |
|---|---|---|
| 3,658,526 | 4/1972 | Haugh .................................... 430/1 |
| 3,973,964 | 8/1976 | Lange ............................... 430/23 X |
| 4,388,388 | 6/1983 | Kornbau et al. ..................... 430/258 |

Primary Examiner—José G. Dees
Attorney, Agent, or Firm—Thomas P. Murphy; Paul A. Fattibene; Edwin T. Grimes

[57] ABSTRACT

An apparatus and method for the generation of patterns on large optics. A coating layer is deposited on the surface of a large substrate, whereupon a photoresist layer is deposited on the coating layer in relatively small localized areas. A flexible mask is fabricated embodying the pattern to be generated. This flexible mask is then aligned with any desired point on the substrate and brought into contact with the photoresist layer. The photoresist layer is then exposed and each localized area is developed and the underlying coating layer is etched. After the excess photoresist material is washed away the pattern, etched into the coating layer, remains.

7 Claims, 3 Drawing Sheets

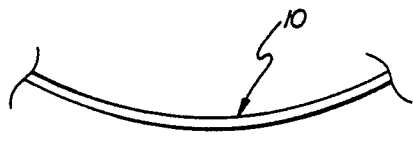
FIG. IA
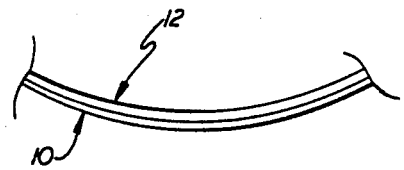
FIG. IB
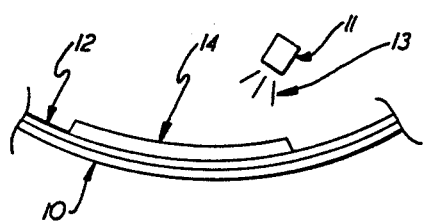
FIG. IC
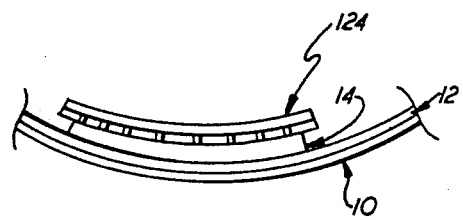
FIG. ID
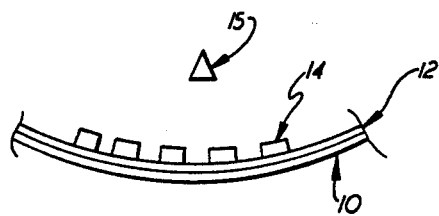
FIG. IE
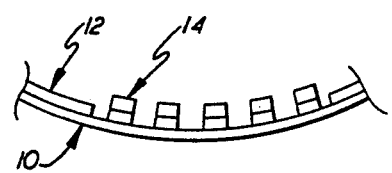
FIG. IF
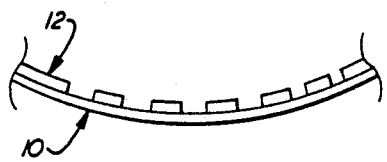
FIG. IG

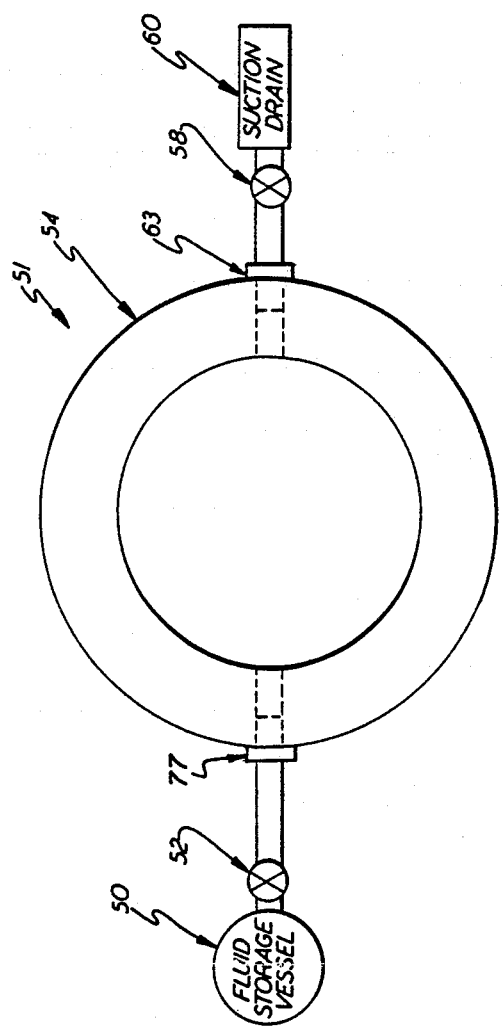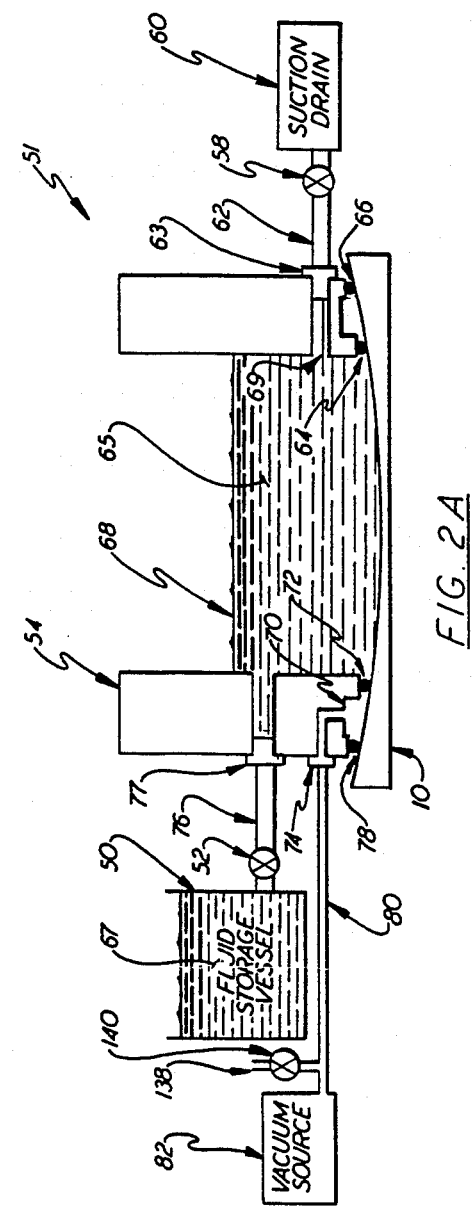

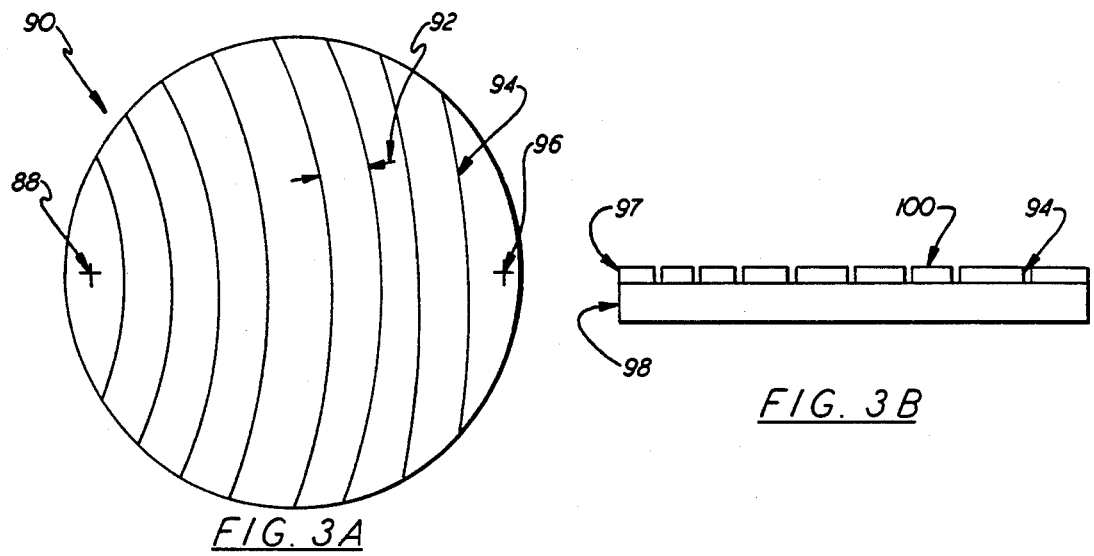
FIG. 3A
FIG. 3B
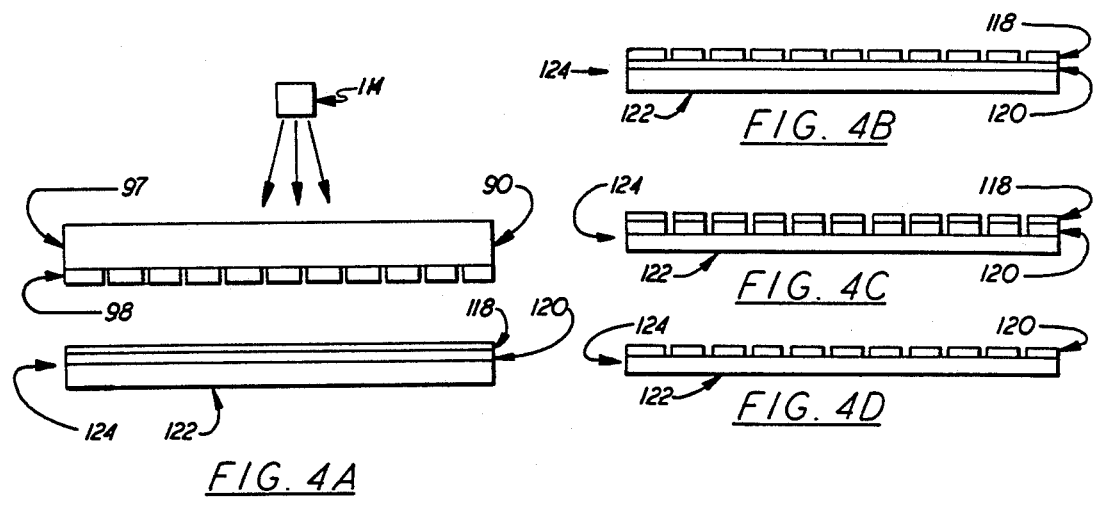
FIG. 4A
FIG. 4B
FIG. 4C
FIG. 4D
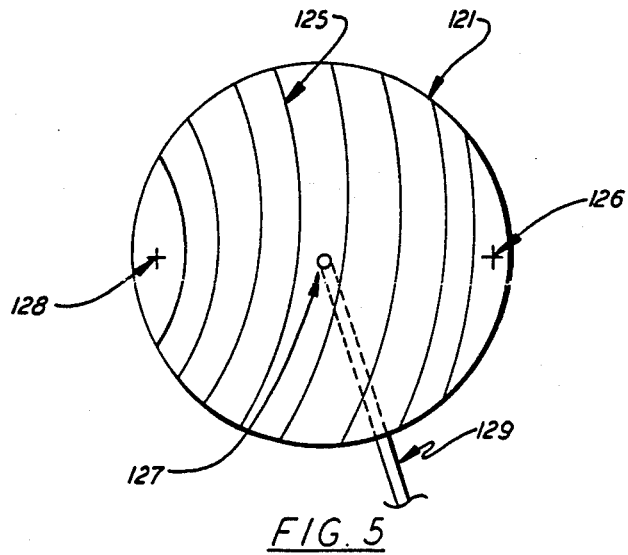
FIG. 5

CONTACT LITHOGRAPHIC FABRICATION OF PATTERNS ON LARGE OPTICS

This application is a division of application Ser. No. 799,390, filed Nov. 18, 1985, now U.S. Pat. No. 4,668,083.

BACKGROUND OF THE INVENTION

The present invention pertains generally to a method and apparatus for fabricating patterns on large optics. More particularly, the present invention pertains to a method and apparatus for fabricating patterns on large optics utilizing contact lithographic fabrication techniques.

Prior art techniques for fabricating patterns such as holographic optical elements on mirrors are represented by the two-beam interference approach. In this technique the substrate of a large optic, coated with metal, is coated with a photoresist material which is exposed to a set of fringes. Upon developing and etching, a holographic pattern is produced in the metallic layer.

The prior art has several drawbacks including requiring long pathlengths, sources having long coherence lengths, long exposure times, wavelength scaling, correction optics, fringe stabilization schemes and limited size and placement of HOES.

To overcome these and other disadvantages of the prior art, the present invention contemplates providing a device which can etch a pattern on a large substrate with accurate placement, accurate line spacing and which is readily scalable to much larger sizes. The pattern is transferred at the exact operating wavelength through the use of photolithographic techniques, thus eliminating the need for correction optics, such as null correctors, to correct for wavelength scaling aberrations. The pattern generated can be a single full aperture zone plate or several subaperture elements. The actual pattern generation is accomplished by a computer generated hologram (CGH) technique using an e-beam generated master and a flexible mask, thus eliminating the conventional two beam interference approach.

While techniques known in the art of photolithography are suitable to conventional applications, they are not easily applied to the fabrication of patterns on large optics.

Accordingly, we have added to the art of photolithography by providing an apparatus and method for depositing a layer of photoresist material in a relatively small localized area on a large curved optic. We have done so without the need for spin-coating, as is common in the prior art, and without the need of an oven to accomplish pre-baking of the photoresist layer. We have also eliminated the need for an oven for post-baking of the photoresist layer after pattern generation using a suitable mask.

In addition we have eliminated the need for dipping of the coated substrate to develop the photoresist layer or etch the metallic layer. This has been done through the provision of a movable fluid-containment device which can deliver developing or etching fluid to a relatively small localized area on the large optic.

BRIEF DESCRIPTION OF THE INVENTION

The invention provides a method and an apparatus to fabricate, on large substrates, a localized optical element. By localized optical element we mean an optical element which is fabricated within an area which is small in relation to the surface area of the large optic.

Briefly, this is accomplished by depositing photoresist in a localized area on a large substrate which may, or may not, be coated, baking the photoresist, separately generating the hologram pattern on a flexible mask, aligning the mask over the photoresist, exposing and developing the photoresist and etching the substrate or coating underlying the photoresist.

The photoresist deposition is accomplished by placing a chamber over the localized area on the large substrate where photoresist is to be placed. A cloud of photoresist is then introduced into the chamber and allowed to fall, by gravity, onto the surface of the large optic. By controlling the conditions of the deposition, the thickness can be controlled and a uniform deposition assured.

The grating pattern desired for the optical element is first transferred onto a coating layer, such as metal, on a master glass plate using computer generated hologram (CGH) technique. The grating master is then replicated onto a high-quality, flat flexible mask. This flat flexible mask is then placed over the proper location on the large optic and aligned to the large optic.

Containment of developing solution over a localized area on the large substrate is accomplished by providing a fluid containment collar which is sealed to the large substrate. Thus chemicals can be introduced into the collar, brought into contact with the photoresist, and flushed out again without disturbing other areas of the substrate. In this manner the photoresist can be developed and the substrate or coating layer underlying the photoresist can be etched.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

BRIEF DESCRIPTION OF THE DRAWINGS

FIG. 1A shows a section of the substrate upon which a holographic optical element is to be placed;

FIG. 1B shows the section of the substrate of FIG. 1A upon which a metallic coating has been overlaid;

FIG. 1C shows the substrate with metallic coating of FIG. 1B over a portion of which has been laid a photoresist layer;

FIG. 1D shows the section of FIG. 1C with a flexible mask in contact with the photoresist layer.

FIG. 1E shows the section of FIG. 1C after the photoresist layer has been exposed, under the flexible mask, and developed;

FIG. 1F shows the section of FIG. 1D after the metallic coating has been etched;

FIG. 1G shows the section of FIG. 1E after the remaining photoresist material has been washed away;

FIG. 2A is a sectional view of a fluid containment collar useful in accomplishing the steps in the present invention illustrated by FIGS. 1E and 1F;

FIG. 2B is a plan view of the fluid containment collar of FIG. 2A;

FIG. 3A is a plan view of a master grating useful in fabricating flexible works;

FIG. 3B is an elevation view of the master grating of FIG. 3A;

FIG. 4A shows a flexible mask, made of a flexible substrate upon which a first metallic layer and a second photoresist layer have been overlaid, being exposed under the master grating of FIGS. 3A and 3B.

FIG. 4B shows the flexible mask of FIG. 4A after the photoresist layer has been developed;

FIG. 4C shows the flexible mask of FIG. 4B after the metallic layer has been etched;

FIG. 4D shows the flexible mask of FIG. 4C after the remaining photoresist material has been washed away;

FIG. 5 is a plan view of the completed flexible mask of FIG. 4D.

DESCRIPTION OF THE PREFERRED EMBODIMENT

While the following description discusses the present invention as being used on a mirror, it should be understood that it has applicability to localized fabrication of etched patterns on any appropriate large substrate.

Further, while the description that follows discusses the fabrication of grating patterns on large optics, it can be understood that the present invention can be used to fabricate any desired pattern on any appropriate large substrate.

FIGS. 1A-1F show, in schematic form, the stages involved in producing holographic optical elements (HOES) on a large mirror. FIG. 1A shows a section of a curved glass substrate 10. In FIG. 1B metallic layer 12, such as aluminum or chromium/gold, has been deposited on top of the glass substrate 10. The deposition of the metallic layer 12 can be accomplished in any convenient manner, such as sputtering. The thickness of the metallic layer 12 determines the groove depth of the completed grating pattern since, as will be explained, the grating pattern comprises lines in the metallic layer 12 with the substrate 10 exposed between the lines. As is known in the art the groove depth of a grating determines, among other things, its efficiency.

FIG. 1C shows a layer of photoresist material 14 which has been deposited on top of the metallic layer 12. The photoresist material 14, e.g., Shipley AZ-1340 B, is deposited in localized areas on the curved substrate 10.

This coating process can be accomplished by using an improvement over the apparatus and method as disclosed in U.S. Pat. No. 4,290,384, and assigned to the same assignee as the present application.

The apparatus and method disclosed in the above-referenced patent are improved upon by making the coating chamber movable across the substrate 10. In addition, the improved method and apparatus uses a coating chamber which can be sealed to the surface of a curved substrate. Thus, a photoresist layer can be deposited on a localized area.

The photoresist layer 14 is pre-baked using radiation 13 from a localized source of radiation 11 such as a hot air gun or a heat lamp.

Following the pre-baking step a flexible mask 124 is located over the photoresist layer 14, aligned with respect to the curved mirror substrate 10 and placed in contact with the photoresist layer 14 as illustrated in FIG. 1D. The apparati and methods whereby these steps are carried out are explained hereinbelow.

1E shows the mirror after the photoresist material 14 has been exposed and developed under the flexible mask. No post-baking of the photoresist layer 14 is required. At this point the photoresist layer 14 contains the holographic grating pattern. An inspection apparatus 15, utilizing known visual, photomicrographic and interferometric techniques, can be used to inspect the pattern to ensure that it is properly made and oriented. If it is incorrect the localized photoresist layer 14 can be removed with an appropriate solvent, such as acetone, and the photoresist layer can be reapplied, as in the step illustrated by FIG. 1B.

The process of fabricating the holographic grating can then start anew without disturbing the substrate 10, the metallic coating 12 or any other localized photoresist layers 14 adjacent to the one removed.

FIG. 1F shows the mirror after the metallic layer 12 has been etched. The method and apparatus whereby the steps of developing and etching, illustrated by FIGS. 1E and 1F, are accomplished will be explained more fully below in reference to FIGS. 2A and 2B.

It can be appreciated, by those skilled in the art, that any material which can be suitably etched can be substituted for the metallic layer 12. Indeed, by selecting the proper substrate 10 and etchant, the pattern can be etched directly into the surface of the substrate 10 thus obviating the metallic layer 12.

FIG. 1G shows the finished mirror with the desired pattern etched into the metallic layer 12 after the photoresist layer 14, remaining after the metallic layer 12 has been etched, has been washed off with a solvent such as acetone.

When the substrate 10 has been coated with a photoresist layer 14 the coating chamber may be moved by any convenient means, not shown, to the next location where it is desired to locate a photoresist layer 14.

The process may be automated by automatically moving the coating chamber from one location to another in a predetermined pattern so as to locate grating patterns in a predetermined pattern on a large optic.

FIG. 3A shows, in a plan view, a master grating 90. This master grating 90 is used to produce a flexible mask as is explained hereinbelow. The master grating 90 comprises a glass substrate 98 made of, for example, ultra low expansion (ULE) glass onto which a metallic layer 97 has been deposited. The metallic layer 97 can be of chromium or aluminum. Onto the coating layer 97 have been etched a series of lines 94. These lines 94 can have a fixed or variable spacing 92 depending upon the type of pattern that is desired. FIG. 3B shows in an elevation view the master of FIG. 3A with the lines 94 separated by lands 100.

Returning now to FIG. 3A, it can be seen that fiducials 88 and 96 are also provided as part of the pattern generated on the master grating 90. The fiducials 88 and 96 are aligned to the grating pattern embodied in the series of lines 94. These fiducials 88 and 96 are replicated on the flexible mask, as explained below, and are useful in aligning the flexible mask with the large optic to which the pattern is to be transferred.

The master 90 of FIGS. 3A and 3B can be generated by any convenient means. In the preferred embodiment such means employ a computer generated hologram (CGH) known in the prior art [see, Malacara, "Optical Shop Testing", pp. 389–397, John Wiley and Sons, NY (1978)] to drive an electron-beam exposure system of the type known by the Perkin-Elmer trademark, MEBES. Such an approach can generate the desired holographic pattern directly onto the coating layer 97 on the master 90 with accuracies of ±0.1 micron. In this manner a diffraction limited grating can be generated.

FIGS. 4A to 4D illustrate the steps necessary to transfer the pattern on the master grating 90 to a flexible mask 124. Referring to FIG. 4A it can be seen that the master grating is disposed between a source of radiation 114 and the flexible mask 124. At this stage in its fabrication the flexible mask 124 consists of a flexible substrate 122, such as glass of 20–50 mils thickness, and metallic layer 120, such as chromium, with a photoresist layer 118, such as Shipley AZ-1340 B, over the metallic layer 120. The metallic layer 120 and the photoresist layer 118 are applied to the substrate 122 in any convenient manner known in the art of photolithography. It should be noted that during the exposure of the flexible mask 124 the side of the master grating 90 with the etched coating layer 98 on it faces the side of the flexible mask 124 with the photoresist layer on it.

After exposure of the flexible mask 124, as shown in FIG. 4A, the flexible mask 124 is developed in any convenient manner known in the art of photolithography resulting in the flexible mask 124 of FIG. 4B. At this point the fiducials and the holographic pattern etched into the coating layer 98 of the master grating 90 has been transferred to the photoresist layer 118 of the flexible mask 124 as shown in FIG. 4B.

FIGS. 4C and 4D also illustrate known steps in the art of photolithography. In FIG. 4C the metallic layer 120 underlying the photoresist layer 110 has been etched down to the substrate 122. FIG. 4D shows the completed flexible mask 124 with the etched metallic layer 120 containing the fiducials and the holographic pattern from the master grating 90 and overlaying the substrate 122. Since the fiducials in the master grating are aligned to the grating pattern in the master grating, so too are the fiducials in the flexible mask 124 aligned to the grating pattern in the flexible mask 124.

FIG. 5 is a plan view of the completed flexible mask 124 of FIG. 4D showing the lines 121 which correspond to the lines 94 of the master grating 90 and the fiducials 128 and 126 corresponding to the fiducials 88 and 96, respectively, of the master grating 90.

Also shown in FIG. 5 is a passage 127 through the flexible mask 124 to which is connected a tube 129. The tube 129 is, in turn, connected to a vacuum source, not shown, and communicates a vacuum to the passage 127. There may be one or more such passages located at any convenient location on the flexible mask 124.

The flexible mask 124 is placed over the localized photoresist layer 14, as shown in FIG. 1F with the metallic layer 120 of the flexible mask 124 nearest the substrate 10. This can be accomplished in any convenient manner, not shown. The fiducials 126 and 128, hence the grating pattern, are then aligned to any desired point on the substrate 10. Such a point could be, for example, the vertex if the substrate 10 were a mirror.

Following assembly of the flexible mask 124 into the template 110 a vacuum is drawn between the flexible mask 124 and the substrate 10 by the vacuum or communicated to the passage 127 as described hereinabove.

With the flexible mask 124 thus substantially in contact with the mirror 87 the photoresist layer 14 of FIG. 1C can be exposed. This is accomplished by any convenient means, not shown, known in the art of photolithography.

The steps of development of the photoresist layer 14 and etching of the metallic layer 12, illustrated by FIGS. 1E and 1F respectively, can be accomplished through the use of the apparatus shown in FIGS. 2A and 2B.

FIG. 2A is a sectional view of a fluid containment collar 51 of which FIG. 2B is a plan view. The fluid containment collar 51 comprises a cylindrical portion 54 fabricated of some chemically inert material, such as Teflon for example. The cylindrical portion 54 has at one end thereof an annular chamber 70 with an o-ring 66 at the outer diameter of the chamber 70 and an o-ring 64 at the inner diameter of the chamber. The cylindrical portion 54 is located in any convenient manner, not shown, over a patch of photoresist 14 to be processed. Further, the cylindrical portion 54 is located so that the o-rings 64 and 66 are in contact with the large substrate 10.

The chamber 70 is in communication with vacuum line 80 through coupling 74. Vacuum line 80 is, in turn, connected to a vacuum source 82. During use of the fluid containment collar 51 fluid 68 is introduced therein. Vacuum source 82 is actuated which causes a vacuum to be drawn in chamber 70. This draws the cylindrical portion 54 closer to the substrate 10, compressing the o-rings 64 and 66 thus sealing the cylindrical portion 54 so as to prevent the leakage of any liquid 65 therefrom. The vacuum in vacuum line 80, and hence in chamber 80, is released by opening stop valve 140 and venting vacuum line 80 to atmosphere through vent 138.

Fluid 67 is stored in fluid storage vessel 50. Fluid storage vessel 50 communicates through stop valve 52, flexible line 76 and fitting 77 to cylindrical portion 54. When it is desired to introduce fluid 67 from the fluid storage vessel 50 to cylindrical portion 54, stop valve 52 is opened so as to allow the fluid 67 to flow into cylindrical portion 54. When the desired fluid level 68 is reached in the cylindrical portion 54, stop valve 52 is closed, thus stopping the flow of fluid 67 from the fluid storage vessel 50 to cylindrical portion 54.

While the feeding of fluid 67 from fluid storage vessel 50 to cylindrical portion 54 is shown as being accomplished by gravity feed, it should be understood that such feeding can be accomplished by pumping the fluid 67 into the cylindrical portion 54 by any controllable means, not shown.

Following the developing or etching steps it is desirous that the cylindrical portion 54 be emptied of fluid and waste matter. Accordingly, suction drain 60, which communicates with the cylindrical portion 54 through stop valve 58, flexible line 62 and fitting 63 is provided. The suction drain line opening 69 into the interior of the cylindrical portion 54 is located as close as practicable to the point where the o-rings 64 and 66 contact the substrate 10. Thus, when the processing step is completed stop valve 58 is opened and suction drain 60 is actuated so that any fluid and waste material contained in cylindrical portion 54 is drawn out.

The operation of the fluid containment collar 51 will now be explained, with particular reference to the steps of exposing and developing the photoresist layer 14 as illustrated by FIG. 1E.

The cylindrical portion 54 is positioned over the patch of the photoresist layer 14 in any convenient manner, not shown. Vacuum source 82 then draws a vacuum in chamber 70 which causes the o-rings 64 and 66 to seal the cylindrical portion 54 to the substrate 10. Stop valve 52 is then opened allowing developing fluid, matched to the photoresist material used, to enter the inside of the cylindrical portion 54. The fluid is allowed to enter the cylindrical portion 54 until any desired fluid level 68 is reached at which time the stop valve 52 is closed.

Following the desired developing period the stop valve 58 is opened and the suction drain 60 is actuated. This causes the fluid level 68 to drop as the fluid 65 is drawn out of the cylindrical portion. The suction drain 60 continues to operate until substantially all of the fluid 65 is drawn out of the cylindrical portion 54 whereupon suction drain 60 is turned off and the stop valve 58 is closed.

Following the developing step the fluid containment collar 51 can be removed so that the developed photoresist layer, as depicted in FIG. 1E, can be cleaned in preparation for etching the metallic layer. This is accomplished by opening stop valve 140 to vent chamber 70 to atmosphere through vacuum line 80 and vent 138. With the vacuum in chamber 70 removed the fluid containment collar 51 is no longer sealed to the large substrate 10 and can easily be removed by any convenient means, not shown.

Following the developing step the developed photoresist layer 14 contains the grating pattern transferred from the master grating 90 to the flexible mask 124 to the photoresist layer 14. Accordingly the grating can be inspected visually, photomicrographically and interferometrically to ensure its accuracy and proper orientation with respect to the large substrate. If it proves to be inaccurate, the photoresist layer 14 can be washed off, re-applied and re-exposed in the manner described above.

The fluid containment collar 51 is now ready for the etching step, illustrated by FIG. 2F. For this step the apparatus and method hereinabove described in reference to the developing step remain the same. The only difference is the fluid 67 in the fluid storage vessel 50. The fluid 67 for the etching step must be appropriate to etch the coating layer 12 which overlays the substrate 10.

Following the etching step the fluid containment collar 51 is removed in the manner described hereinabove. That potion of the photoresist layer 14 remaining after the etching step can be cleaned off with a suitable solvent, such as acetone.

Following the cleaning step the finished grating, as illustrated by FIG. 1G, can be visually, interferometrically and photomicrographically inspected.

If desired, a metal overcoat, such as chromium, can now be deposited on the grating so that any other multilayer dielectric coatings can be deposited, if desired.

There has thus been described an apparatus and a method for fabricating local gratings on a large substrate. Such gratings have the advantage of being fabricated in local patches on a large substrate, are very accurate, can be easily removed at an interim step in the fabrication process if incorrectly located or made, give diffraction limited performance, have high line quality and line widths of one micrometer or less, eliminate need for spin coating of photoresist or oven bake of photoresist and eliminate the need for dipping to develop or clean photoresist or etch metallic layer. In addition, the entire process can be scaled up to larger patches by using a larger containment collar 51 and photoresist application chamber 20. Further, it can be seen that the present method and apparatus can supply grating patches properly aligned at any point on a substrate, such as a large optic.

Other modifications of the present invention are possible in light of the above description which should not be deemed as limiting the invention beyond those limitations contained in the claims which follow.

What is claimed is:

1. A method for the placement of an optical element in a localized area on a large substrate which comprises:
    depositing a photoresist layer on said large substrate in said localized area;
    positioning a flexible mask, with a pattern thereon, over said photoresist layer;
    aligning said pattern on said flexible mask to said photoresist layer on said large substrate;
    bringing said flexible mask substantially into contact with said photoresist layer;
    exposing to radiation said photoresist layer in said localized area;
    circumscribing said localized area with a movable fluid containment collar;
    supplying developing fluid to said movable fluid containment collar;
    removing said developing fluid from said fluid containment collar;
    supplying etching fluid to said movable fluid containment collar;
    removing said etching fluid from said movable fluid containment collar; and
    removing the remaining photoresist layer from said localized area.

2. A method as claimed in claim 1 which further comprises:
    inspecting said photoresist layer after removing said developing fluid from said fluid containment collar.

3. A method as claimed in claim 1 which further comprises:
    inspecting said substrate after removing the remaining photoresist layer from said localized area.

4. A method as claimed in claim 1 wherein said step of bringing said flexible mask substantially into contact with said photoresist layer comprises:
    providing a vacuum source;
    providing one or more passages through said flexible mask;
    communicating said vacuum source with said one or more passages through said flexible mask.

5. A method as claimed in claim 1 which further comprises:
    coating said substrate with a coating layer prior to depositing said photoresist layer on said large substrate in said localized area.

6. A method as claimed in claim 1 wherein said step of coating said substrate with a coating layer comprises:
    coating said substrate with a metallic layer.

7. A method as claimed in claim 5 which further comprises:
    baking said photoresist layer after depositing said photoresist layer on said coating layer in said localized area.

* * * * *